(12) United States Patent
Kim et al.

(10) Patent No.: US 7,750,714 B2
(45) Date of Patent: Jul. 6, 2010

(54) SEMICONDUCTOR DEVICE HAVING INPUT CIRCUIT WITH OUTPUT PATH CONTROL UNIT

(75) Inventors: Mi Hye Kim, Seoul (KR); Jae Jin Lee, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 12/136,878

(22) Filed: Jun. 11, 2008

(65) Prior Publication Data
US 2009/0185413 A1 Jul. 23, 2009

(30) Foreign Application Priority Data
Jan. 18, 2008 (KR) .................... 10-2008-0005898

(51) Int. Cl.
*H03K 3/00* (2006.01)
(52) U.S. Cl. .................... 327/291; 327/63; 327/68; 327/299
(58) Field of Classification Search .......... 327/63, 327/65, 67, 68, 77, 81, 85, 87, 89, 560, 563, 327/291, 294, 299, 379
See application file for complete search history.

(56) References Cited

U.S. PATENT DOCUMENTS

| 4,121,121 | A * | 10/1978 | Gabeler | 327/72 |
| 6,288,577 | B1 * | 9/2001 | Wong | 327/65 |
| 6,320,406 | B1 * | 11/2001 | Morgan et al. | 326/14 |
| 6,781,456 | B2 * | 8/2004 | Pradhan | 330/69 |

FOREIGN PATENT DOCUMENTS

| KR | 1019990012403 A | 2/1999 |
| KR | 1020030078310 A | 10/2003 |
| KR | 1020040095957 A | 11/2004 |
| KR | 1020070073212 A | 7/2007 |

* cited by examiner

*Primary Examiner*—An T Luu
(74) *Attorney, Agent, or Firm*—Ladas & Parry LLP

(57) ABSTRACT

A semiconductor device minimizes generation of an output signal skew of an input buffer and thus stabilizes the operation of the semiconductor device. The semiconductor integrated circuit includes an input potential detection unit outputting a detection signal in response to a level of an input signal, an input buffer buffering the input signal, and an output path control unit that receives the output signal of the input buffer and the detection signal of the input potential detection unit and outputs an output driving signal in response to the level of the detection signal.

21 Claims, 5 Drawing Sheets

SEMICONDUCTOR DEVICE HAVING INPUT CIRCUIT WITH OUTPUT PATH CONTROL UNIT

CROSS-REFERENCE TO RELATED APPLICATIONS

The present application claims priority to Korean patent application number 10-2008-0005898 filed on Jan. 18, 2008, which is incorporated herein by reference in its entirety.

BACKGROUND OF THE INVENTION

The present invention relates to a semiconductor device, and more particularly to an input circuit that stabilizes an operation of a semiconductor device.

A semiconductor device generally includes a signal transferring unit receiving and transferring a signal and a signal processing unit processing the signal transferred by the signal transferring unit according to a unique predetermined operation.

The signal processing unit is generally referred to as a core circuit of a semiconductor device, and as many devices as allowed by semiconductor design and processing technology are integrated in the core circuit.

The signal transferring unit includes an input circuit, which transfers an external signal to the signal processing unit within a semiconductor device, and an output circuit, outputs data transferred from the signal processing unit to the outside.

In a semiconductor device, particularly in a semiconductor memory device, the input circuit primarily receives an external address signal or an external data signal and transfers it to an internal memory core region, and the output buffer outputs a data signal corresponding to the inputted address to the outside.

The operation of a semiconductor device is only reliable when accurate buffering is ensured, and therefore an input circuit that transfers the external data signal or the external address signal to the inside and performs an accurate buffering operation is desired.

FIG. 1 is a circuit diagram showing an input circuit of a semiconductor device according to a related art, and illustrates an input circuit having a differential amplifier structure in a general semiconductor memory device, for example a DRAM. The circuit in FIG. 1 includes an input buffer 100 receiving input signals in and inb, a delaying circuit 200 delaying the output signal of the input buffer 100, a clock buffer 300 receiving clock signals CLK and CLKB and a strobe & latch circuit 400 receiving both the output of the delaying circuit 200 and the output signal of the clock buffer 300.

In general, the input buffer 100 receives and differentially amplifies the input signals in and inb. For example, the control signals in and inb can be an external signal such as a memory address signal, a control signal, or other such signal.

The delaying circuit 200 adjusts a timing, i.e., a setup time or a hold time, that synchronizes the input signals in and inb (e.g., an address signal, a control signal, or other such signal) with a clock.

The clock buffer 300 receives the system clock signals CLK and CLKB from the outside.

The strobe & latch circuit 400 receives both the output of the clock buffer 300 and the output of the delaying circuit 200 and performs a clock synchronization.

The input circuit in FIG. 1 is configured as a differential input buffer that receives a differential signal. Herein, the differential input refers to signals having opposite phases, such as clocks CLK and CLKB.

The input signals in and inb are inputted into the input buffer 100, which differentially amplifies the input signals in and inb. The crossing point of the differential input (the point at which the signal in and the signal inb are crossed) is referred to as VIX.

Herein, generally the level of the crossing point VIX is a voltage reference level Vref, i.e., VCC/2. However, it may also be possible that the level of the crossing point VIX is not exactly adjusted to the level of the reference voltage Vref because the influence of a noise or other such disturbance in the system.

It is required that an output signal react at a constant speed with respect to the input signal even when the level of the crossing point VIX is higher or lower than the Vref level. This is because, when an output signal skew is generated, the skew influences an internal operation timing, and as such prevents the stable operation of a semiconductor integrated circuit.

FIG. 2 is a graph illustrating the variation in the operation speed of the input buffer 100 according to the variation in the input potentials of the input signals in and inb of FIG. 1, and variation in delay extent 't' according to the variation in the input potentials of the input signals in and inb is shown. Herein, 't' is a time taken for the input signals in and inb to be both inputted into the input buffer 100 and then outputted from the input buffer 100. Meanwhile, the variation pattern or the variation amount of 't' may be varied as the type of the input buffer 100.

FIG. 3 shows a general circuit diagram of a conventional differential amplifying structure, and shows an example of an input buffer 100 having the properties described above with reference to FIG. 2.

In the conventional differential amplifying structure shown in FIG. 3, when an enable signal en becomes a logic high level, a driving transistor 32 is turned on and the input buffer 100 operates. That is, the input buffer 100 compares and amplifies the levels of the input signals in and inb, and outputs a buffer output signal buf_out.

When the enable signal en becomes a logic low level, the driving transistor 32 is turned off and the input buffer 100 no longer operates. That is, when enable signal en is at a logic low level, the input buffer 100 does not compare the input signals in and inb, rather the input buffer 100 outputs the buffer output signal buf_out, at a high level, according to the operation of the PMOS transistors 34 and 36, which receive the enable signal en through respective gates. The buffer output signal buf_out is maintained at a high level so as to prevent a node outputting the buffer output signal buf_out from being floated when the input buffer 100 is in the disabled state.

Referring again to FIG. 2, the crossing point VIX is higher than the Vref level during the period A PERIOD, and the crossing point VIX is lower than the Vref level during the period B PERIOD. FIG. 2 shows that during the period B PERIOD 't' has greater value than during the period A PERIOD. As shown in FIG. 2, as the input levels of the input signals in and inb are decreased, the setup time and the hold time are largely varied by delay of the output signal and thus the input buffer does not operate stably.

As described above, in a related art, there is no device that compensates for the output signal skew generated according to the variation in the input potential level and thus the output signal skew of the input buffer 100 has an influence on the internal timing when the input potential is high or low. As the result, there is a problem with the conventional semiconductor device in that a semiconductor memory device may malfunction when the output signal skew occurs.

SUMMARY OF THE INVENTION

There is provided a semiconductor device that minimizes generation of an output signal skew of the input buffer and thus stabilizes the operation of the semiconductor device.

Also, there is provided a semiconductor device that controls an output timing of an output signal in response to a level of an input signal.

According to a first aspect of the present invention, a semiconductor device comprises an input potential detection unit outputting a detection signal in response to a level of an input signal, an input buffer buffering the input signal, and an output path control unit receiving the output signal of the input buffer and the detection signal of the input potential detection unit and outputting an output driving signal in response to the level of the detection signal.

Preferably, the input potential detection unit includes a reference voltage generation unit generating a reference voltage an input unit transmitting the reference voltage in response to the level of the input signal, and an output control unit outputting the reference voltage transmitted from the input signal as the detection signal in response to an activation of an enable signal.

Preferably, the input unit transmits the reference voltage when the level of the input signal is lower than a predetermined level.

Preferably, the enable signal is an enable signal of the input buffer.

Preferably, the input buffer is a buffer in a structure that differentially amplifies the input signal through the current sink unit.

Preferably, the input buffer is driven in response to an activation of an enable signal.

Preferably, the output path control unit includes a first path control unit receiving the output signal of the input buffer and the detection signal, a second path control unit receiving the output signal of the input buffer and the detection signal, and delaying and transmitting the input, and an output unit receiving the output signals of the first path control unit and the second path control unit and generating an output driving signal.

Preferably, the first path control unit includes a first decoder receiving the output signal of the input buffer and an activated input signal of the detection signal.

Preferably, the second path control unit includes a second decoder receiving the output signal of the input buffer and an inactivated signal of the detection signal, and a delay unit delaying and transmitting the output signal of the second decoder.

Preferably, the output unit includes a third decoder receiving the output signal of the first path control unit and the output signal of the second path control unit, and generating the output driving signal.

According to a second aspect of the present invention, a semiconductor device comprises an input potential detection unit outputting a detection signal in response to a level of an input signal and an input buffer including a buffer means that buffers the input signal and an output path control unit generating an output driving signal in response to the level of the detection signal with the output signal of the buffer means and the detection signal of the input potential detection unit.

Preferably, the input potential detection unit includes a reference voltage generation unit generating a reference voltage, an input unit transmitting the reference voltage in response to the level of the input signal, and an output control unit outputting the reference voltage transmitted from the input signal as the detection signal in response to an activation of an enable signal.

Preferably, the input unit transmits the reference voltage when the level of the input signal is lower than a predetermined level.

Preferably, the enable signal is an enable signal of the input buffer.

Preferably, the buffer means of the input buffer is a buffer in such a structure that differentially amplifies the input signal through the current sink unit.

Preferably, the buffer means of the input buffer is driven in response to an activation of an enable signal.

Preferably, the output path control unit of the input buffer includes a first path control unit receiving the output signal of the input buffer and the detection signal; a second path control unit receiving the output signal of the input buffer and the detection signal, and delaying and transmitting the input, and an output unit receiving the output signals of the first path control unit and the second path control unit and generating an output driving signal.

Preferably, the first path control unit includes a first decoder receiving the output signal of the input buffer and an activated input signal of the detection signal.

Preferably, the second path control unit includes a second decoder receiving the output signal of the input buffer and an inactivated signal of the detection signal, and a delay unit delaying and transmitting the output signal of the second decoder.

Preferably, the output unit includes a third decoder receiving the output signal of the first path control unit and the output signal of the second path control unit, and generating the output driving signal.

DESCRIPTION OF SPECIFIC EMBODIMENTS

Hereinafter, preferred embodiments of the present invention will be described in detail with reference to the accompanying drawings.

The present invention includes an input circuit of a semiconductor device that minimizes output signal skew even when the input signals (e.g., address signals, various control signals, data signals, and other such signals) is inputted low at a low level, thereby stabilizing the operation of the circuit as a whole.

According to an embodiment of the present invention, a semiconductor device includes an input potential detection unit that outputs a detection signal in response to a level of an input signal, and an input buffer that buffers the input signal, and an output path control unit that receives both the output of the input buffer and the detection signal of the input potential detection unit, and generates an output driving signal in response to the level of the detection signal.

In the above configuration, the output path control unit may be designed integrally with the input buffer or alternatively may be designed separately from the input buffer.

Figure 4:
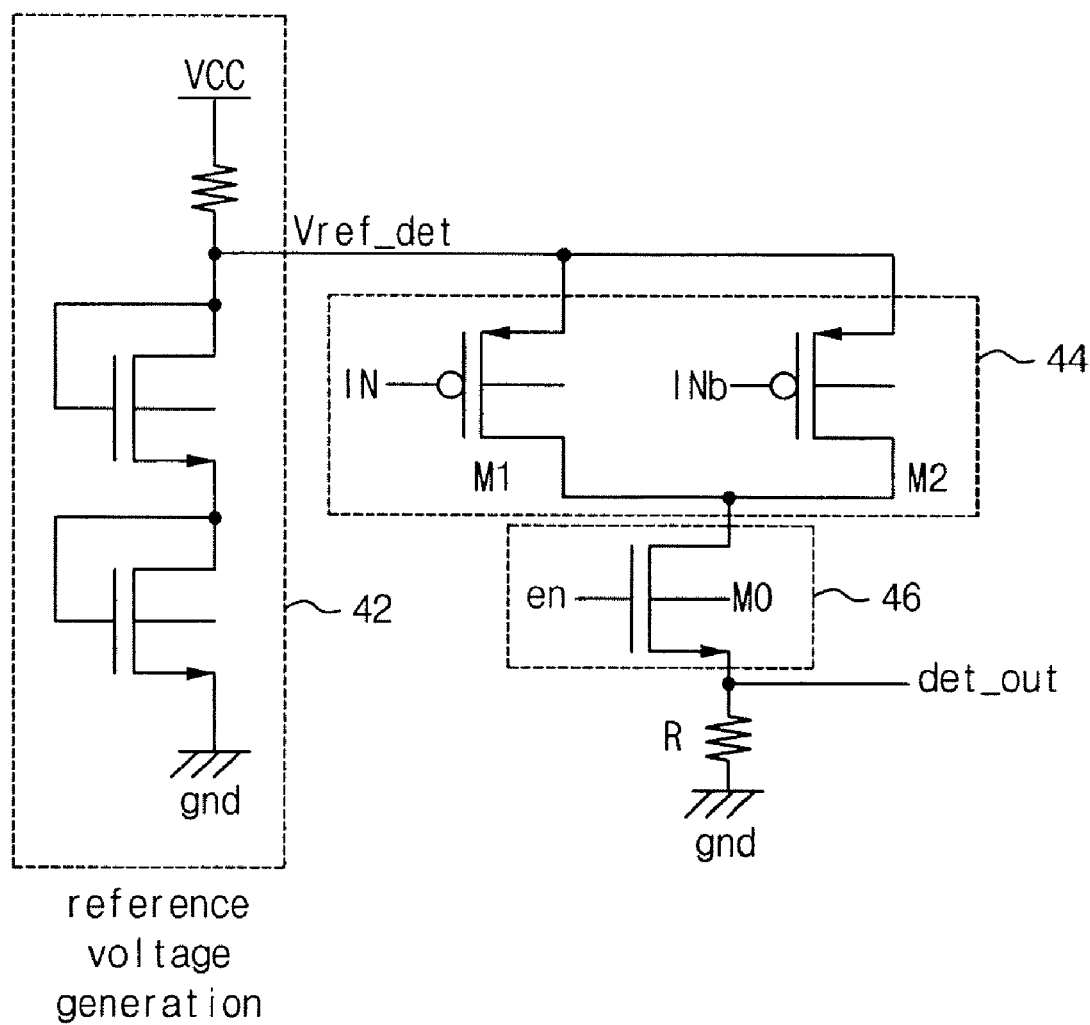
FIG. 4 is a circuit diagram showing an example of an input potential detection unit according to an embodiment of the present invention.

FIG. 4 is a circuit diagram showing an example of an input potential detection unit according to an embodiment of the present invention.

The input potential detection unit shown in FIG. 4 includes a reference voltage generation unit 42, which generates a reference voltage Vref_det, an input unit 44, which receives the reference voltage Vref_det and transmits the reference voltage Vref_det according to the level of input signals IN and INb, and an output control unit 46, which receives the reference voltage Vref_det transmitted via the input unit 44 and outputs the reference voltage Vref_det as a detection signal det_out according to an enable signal en.

The input unit 44 transmits the reference voltage Vref_det when the level of the input signals IN and INb is lower than a predetermined level (conventionally, this predetermined level is determined as a product specification). The enable signal en is an enable signal of the input buffer. The reference voltage generation unit 42 may be a conventional constant voltage generation circuit.

The input unit 44 may include a PMOS transistor M1 that receives the input signal IN and a PMOS transistor M2 receiving the input signal INb via respective gates. The output control unit 46 may include an NMOS transistor M0 that receives the input buffer enable signal en via a gate thereof.

The operation of the device according to the configuration as shown in FIG. 4 is described below.

The level of the reference voltage Vref_det outputted from the reference voltage generation unit 42 may be varied according to the configuration and design of the reference voltage generation circuit 42. The enable signal en, which is an input signal of the NMOS transistor M0 configuring the output control unit 46, is identical to the input buffer enable signal.

The enable signal en has a logic high level when the input buffer is in an enable state, and has a logic low level when the input buffer is in a disable state. The input potential detection unit circuit shown in FIG. 4 operates when the enable signal en has a logic high level, and the NMOS transistor M0 configuring the output control unit 46 is turned off and the detection signal det_out is fixed to a low level when the enable signal has a logic low level.

In the input potential detection unit as shown in FIG. 4, the PMOS transistors M1 and M2 of the input unit 44 receive the input signals IN and INb. When the input signals IN and INb have a high level the detection signal det_out transitions to a low level, and when the input signals IN and INb have a low level the detection signal det_out transitions to a high level.

Figure 5:
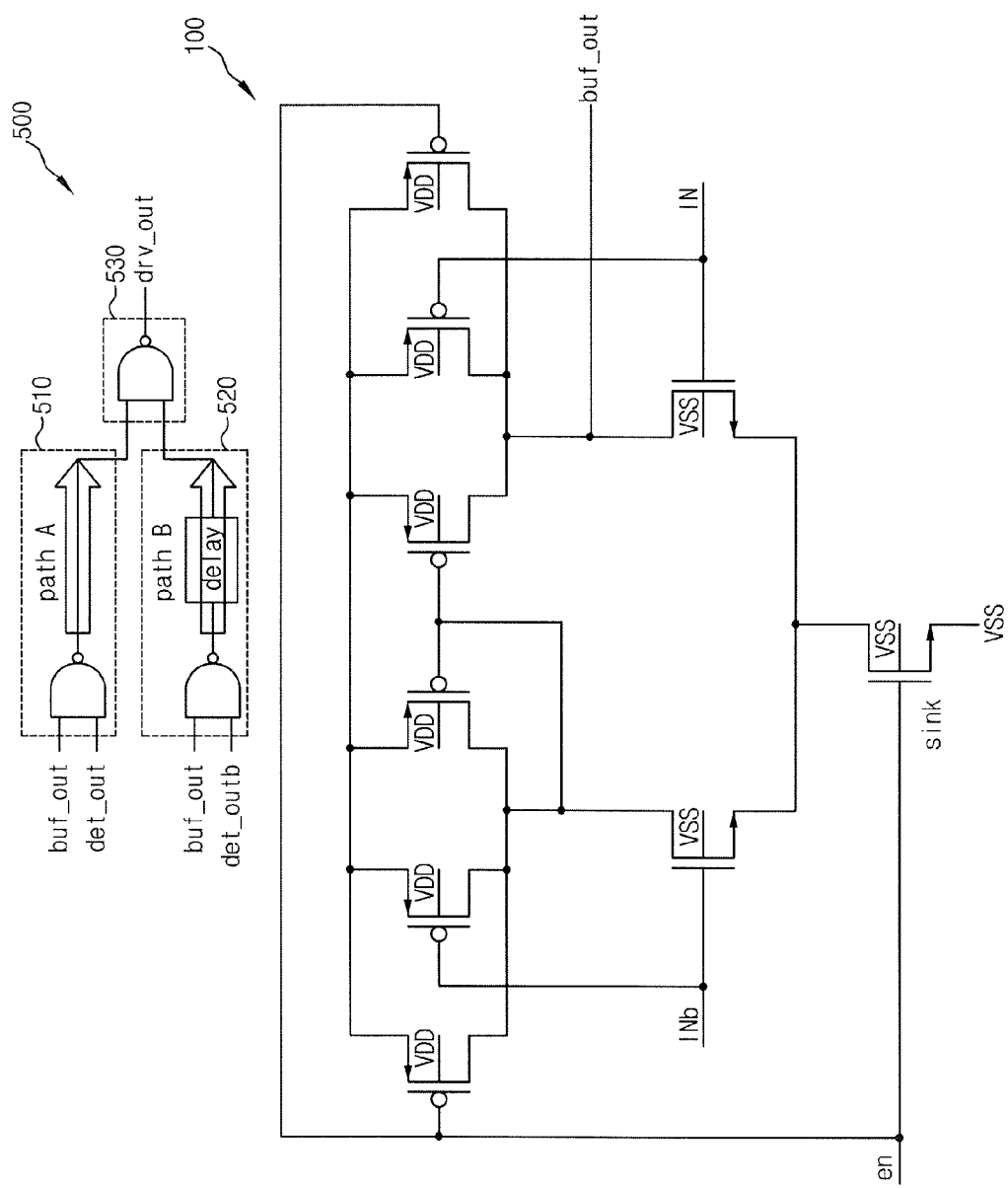
FIG. 5 is a circuit diagram showing an example of an input buffer according to an embodiment of the present invention.

FIG. 5 is a circuit diagram showing an example of an input buffer having a second current sink unit according to an embodiment of the present invention. In FIG. 5 a buffer circuit of a conventional differential amplifying structure is denoted by the reference numeral 100, and the output path control unit according to the present invention is denoted by the reference numeral 500.

Figure 1:
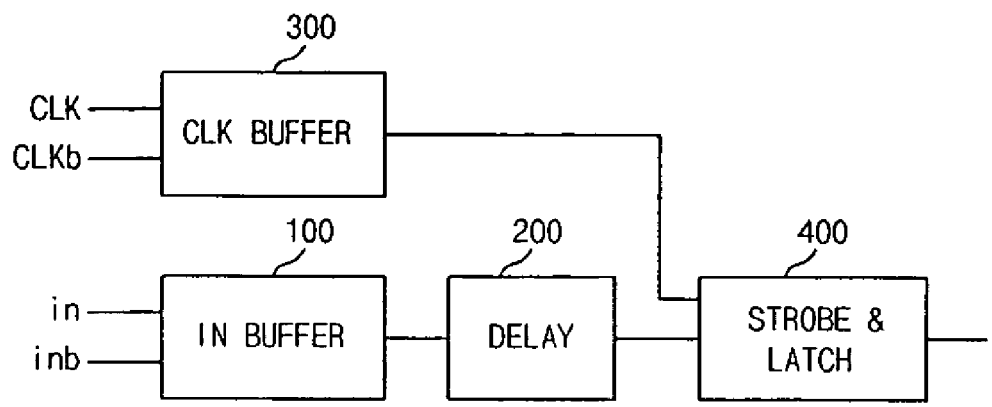
FIG. 1 is a block diagram showing a conventional input circuit.
Figure 2:
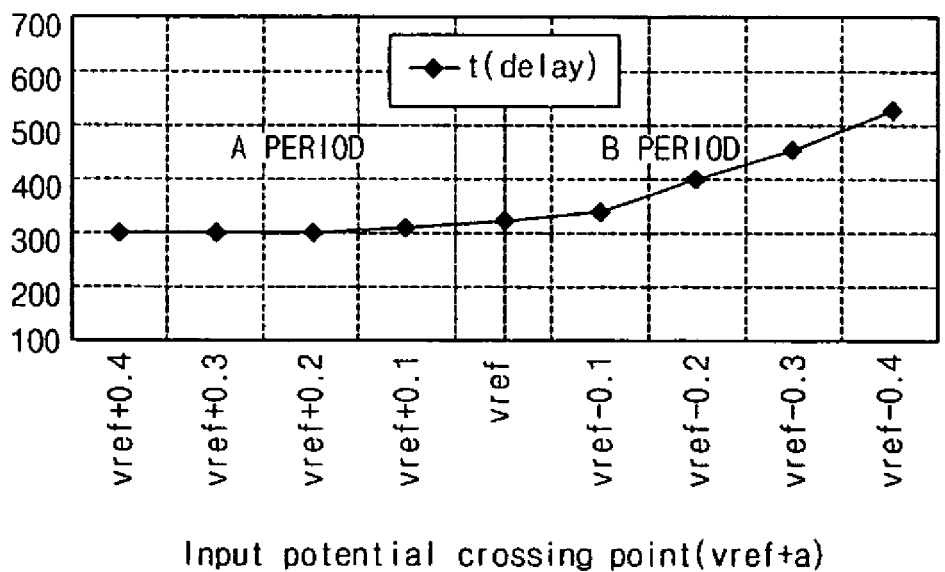
FIG. 2 is a graph illustrating an operation property of the input buffer in FIG. 1.
Figure 3:
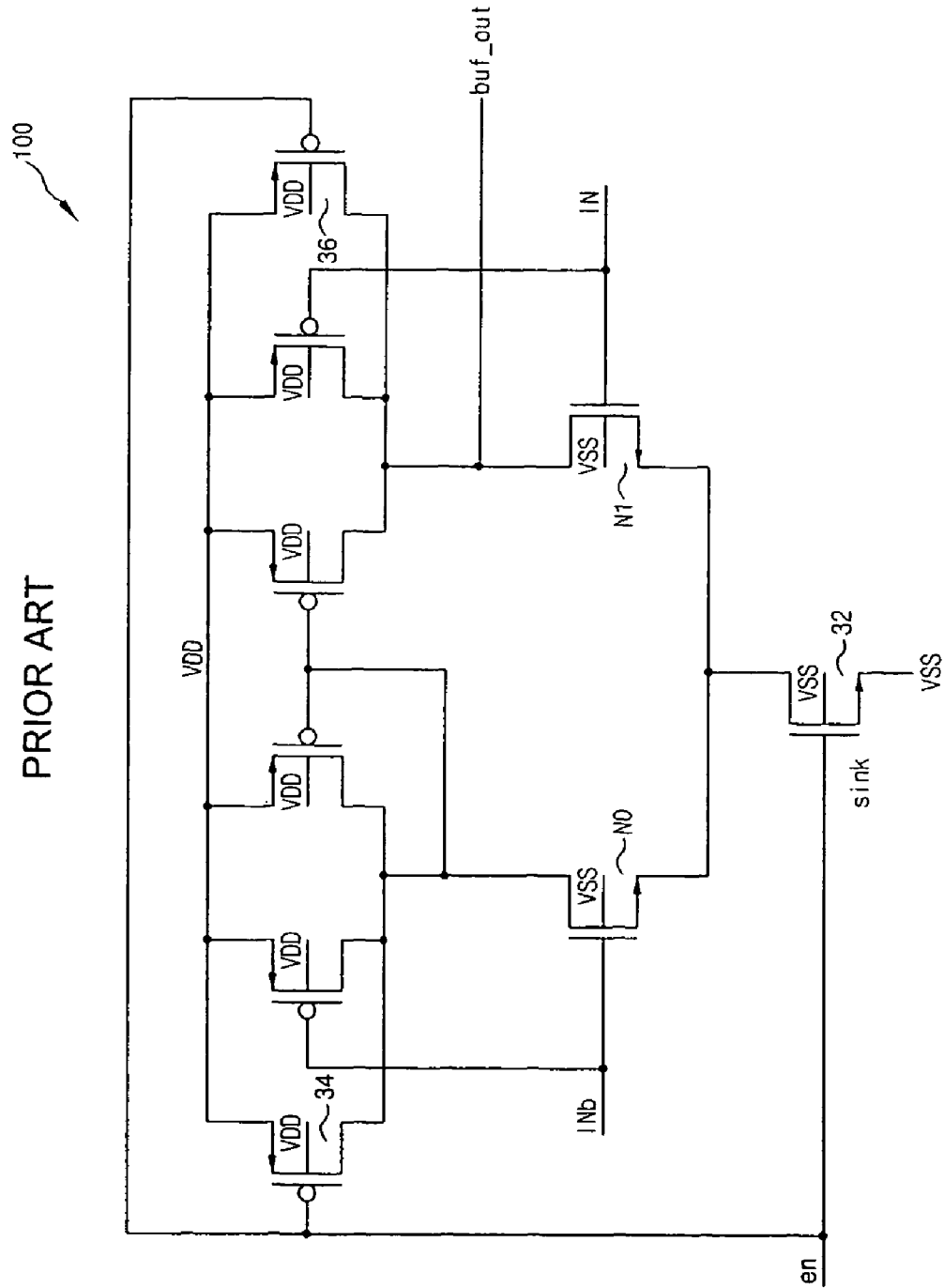
FIG. 3 is a circuit diagram showing the input buffer in FIG. 1.

In FIG. 5, the buffer circuit 100 is identical to the configuration of the circuit shown in FIG. 3 and described above, and thus is given the same reference numeral. Herein, the input buffer may include both the buffer circuit 100 and the output path control unit 500, or the input buffer may include the buffer circuit 100 alone and the output path control unit 500 may be a separate component.

In the configuration in FIG. 5, the buffer circuit 100 is provided in a structure that differentially amplifies the input signals IN and INb. The buffer circuit 100 is driven in response to activation of the enable signal en.

The output path control unit 500 includes a first path control unit 510 receiving both the output signal buf_out from the buffer circuit 100 and the detection signal det_out, a second path control unit 520 that receives both the output signal buf_out from the buffer circuit 100 and the detection signal det_out and delays and transmits the signals, and an output unit 530 receiving the output signals of the first path control unit 510 and the second path control unit 520 and outputting an output driving signal drv_out.

The first path control unit 510 includes a first decoder receiving both the output signal buf_out from the buffer circuit 100 and the detection signal det_out. Herein, the first decoder is a NAND gate.

The second path control unit 520 includes a second decoder receiving both the output signal buf_out from the buffer circuit 100 and an inactivated signal det_outb of the detection signal det_out, and a delay unit delaying and transmitting the output signal of the second decoder. Herein, the second path control unit 520 is configured to receive the detection signal det_outb. Alternatively, the second path control unit 520 may be designed so that the detection signal det_outb is separately supplied or the detection signal det_out is supplied via an inverter. The second decoder is a NAND gate as shown and the delay unit may be an inverter chain.

The output unit 530 includes a third decoder receiving both the signal output from the first path control unit 510 and the signal output from the second path control unit 520 and the output unit 530 generates the output driving signal drv_out. Herein, the third decoder is a NAND gate.

Further, a first path pathA is formed through the first path control unit 510, and a second path pathB is formed through the second path control unit 510.

Figure 6A:
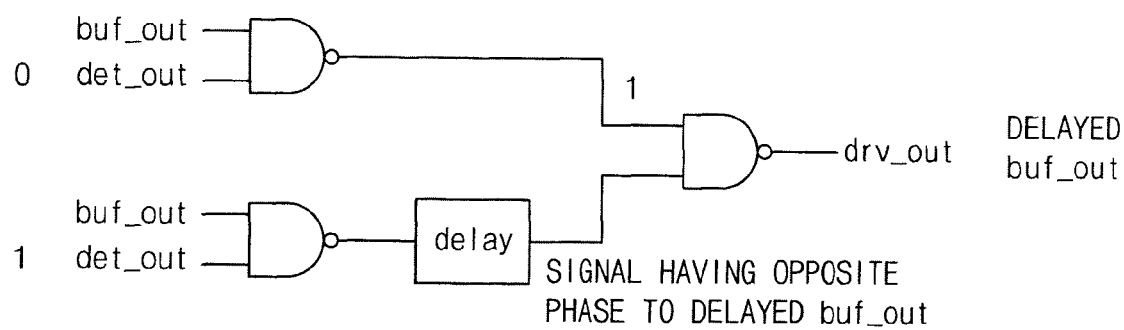
FIGS. 6A and 6B are views circuitously explaining generation process of an output driving signal according to potential level of an input signal.
Figure 6B:
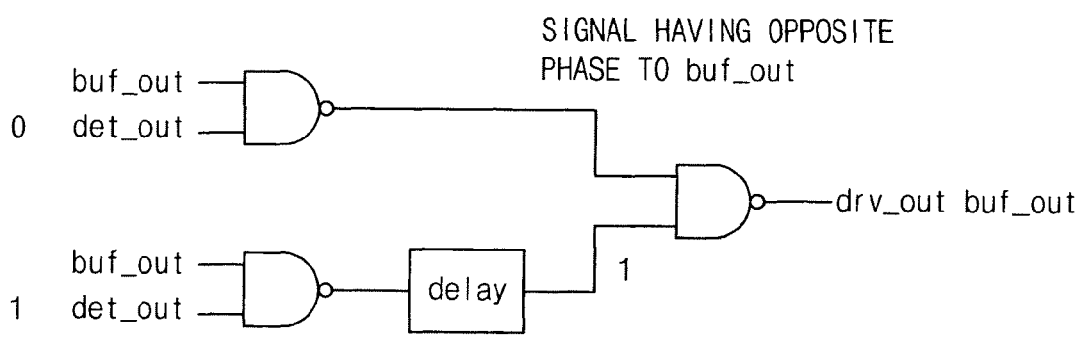

FIGS. 6A and 6B are circuit views showing the process of generating an output driving signal according to the potential level of an input signal.

Referring to FIGS. 6A and 6B, when the buffer circuit 100 is in an enabled state and the voltage of the input signal is low, the enable signal en='H' and the detection signal det_out='H', where 'H' means logic level high, and the signal buf_out is outputted as the signal drv_out through the first path pathA in FIG. 5.

When the buffer circuit 100 is in an enabled state and the voltage of the input signal is high, the enable signal en='H' and the detection signal det_out='L', where 'L' means logic level low, and the signal buf_out is outputted as the signal drv_out through the second path pathB in FIG. 5.

When the buffer circuit 100 is in a disabled state, the enable signal en='L' regardless of the level of the input voltage and the signal buf_out and the signal drv_out become a high level. Referring to FIGS. 6A and 6B, respective driving manners in A and B periods that are the first and second paths are shown. As such, the signal buf_out is delayed when the delay extent 't' is relatively small and thus the signal skew is minimized.

According to this embodiment of the present invention, the output of the buffer circuit is outputted without delay when the input potential is low, and a delaying element is added to the output of the buffer circuit when the input potential is high to minimize the skew of the entire buffer output according to the input potential. As such, a DRAM or other semiconductor integrated circuit can maintain stable operation regardless of the input potential level.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

What is claimed is:

1. A semiconductor device, comprising:
   an input potential detection unit receiving an input signal and outputting a detection signal in response to a level of the input signal, wherein the input potential detection unit comprises:
      a reference voltage generation unit generating a reference voltage;
      an input unit receiving the reference voltage and transmitting the reference voltage in response to the level of the input signal; and
      an output control unit receiving the reference voltage transmitted from the input unit and outputting the reference voltage transmitted from the input unit as the detection signal in response to an activation of an enable signal;
   an input buffer receiving the input signal and buffering the input signal; and
   an output path control unit receiving both an output signal of the input buffer and the detection signal of the input potential detection unit and outputting an output driving signal in response to a level of the detection signal.

2. The semiconductor device as set forth in claim 1, wherein the input unit transmits the reference voltage when the level of the input signal is lower than a predetermined level.

3. The semiconductor device as set forth in claim 1, wherein the enable signal is an enable signal' of the input buffer.

4. The semiconductor device as set forth in claim 1, wherein the input buffer is a buffer in such a structure that differentially amplifies the input signal through a current sink unit.

5. The semiconductor device as set forth in claim 4, wherein the input buffer is driven in response to an activation of an enable signal.

6. The semiconductor device as set forth in claim 1, wherein the output path control unit comprises:
   a first path control unit receiving and combining together the output signal of the input buffer and the detection signal as an output signal of the first path control unit;
   a second path control unit receiving and combining together the output signal of the input buffer and the detection signal control unit and delaying and transmitting the output signal of the second path control unit; and
   an output unit receiving and combining together the output signal of the first path control unit and the output signal of the second path control unit and generating an output driving signal.

7. The semiconductor device as set forth in claim 6, wherein the first path control unit comprises a first decoder receiving the output signal of the input buffer and an activated input signal of the detection signal.

8. The semiconductor device as set forth in claim 7, wherein the first decoder comprises a NAND gate.

9. The semiconductor device as set forth in claim 7, wherein the second path control unit comprises:
   a second decoder receiving the output signal of the input buffer and an inactivated signal of the detection signal; and
   a delay unit delaying and transmitting the output signal of the second decoder.

10. The semiconductor device as set forth in claim 9, wherein the second decoder comprises a NAND gate.

11. The semiconductor device as set forth in claim 9, wherein the output path control unit comprises a third decoder receiving and combining together the output signal of the first path control unit and the output signal of the second path control unit, and the third decoder generating the output driving signal.

12. The semiconductor device as set forth in claim 11, wherein the third decoder comprises a NAND gate.

13. A semiconductor device, comprising:
   an input potential detection unit outputting a detection signal in response to a level of an input signal, wherein the input potential detection unit comprises:
      a reference voltage generation unit generating a reference voltage;
      an input unit receiving the reference voltage and transmitting the reference voltage in response to the level of the input signal; and
      an output control unit receiving the reference voltage transmitted from the input unit and outputting the reference voltage transmitted from the input signal as the detection signal in response to an activation of an enable signal;
   an input buffer including a buffer unit that buffers the input signal; and
   an output path control unit receiving both an output signal of the input buffer and the detection signal, and the output path control unit generating an output driving signal in response to the level of the detection signal and the output signal of the input buffer unit.

14. The semiconductor device as set forth in claim 13, wherein the input unit transmits the reference voltage when the level of the input signal is lower than a predetermined level.

15. The semiconductor device as set forth in claim 13, wherein the enable signal is an enable signal of the input buffer.

16. The semiconductor device as set forth in claim 13, wherein the buffer unit of the input buffer is a buffer in a structure that differentially amplifies the input signal through a current sink unit.

17. The semiconductor device as set forth in claim 16, wherein the buffer unit of the input buffer is driven in response to an activation of an enable signal.

18. The semiconductor device as set forth in claim 13, wherein the output path control unit comprises:
   a first path control unit receiving and combining together the output signal of the input buffer and the detection signal as an output signal of the first path control unit;
   a second path control unit receiving and combining together the output signal of the input buffer and the detection signal as an output signal of the second path control unit, and delaying and transmitting the output signal of the second path control unit; and
   an output unit receiving the output signal of the first path control unit and the output signal of the second path control unit and generating the output driving signal.

19. The semiconductor device as set forth in claim 18, wherein the first path control unit comprises a first decoder receiving the output signal of the input buffer and an activated input signal of the detection signal.

20. The semiconductor device as set forth in claim 19, wherein the second path control unit comprises:

a second decoder receiving the output signal of the input buffer and an inactivated signal of the detection signal; and a delay unit delaying and transmitting the output signal of the second decoder.

21. The semiconductor device as set forth in claim 18, wherein the output unit further comprises a third decoder receiving and combining together the output signal of the first path control unit and the output signal of the second path control unit, and the third decoder generating the output driving signal.

* * * * *